US008988268B2

(12) United States Patent
Sugimoto et al.

(10) Patent No.: US 8,988,268 B2
(45) Date of Patent: Mar. 24, 2015

(54) ANALOG-DIGITAL CONVERTER AND ANALOG-DIGITAL CONVERSION METHOD

(71) Applicant: Kabushiki Kaisha Toshiba, Minato-ku (JP)

(72) Inventors: Tomohiko Sugimoto, Kanagawa (JP); Hirotomo Ishii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/021,821

(22) Filed: Sep. 9, 2013

(65) Prior Publication Data

US 2014/0145868 A1 May 29, 2014

(30) Foreign Application Priority Data

Nov. 27, 2012 (JP) ................................ 2012-258614

(51) Int. Cl.
*H03M 1/08* (2006.01)
*H03M 1/38* (2006.01)

(52) U.S. Cl.
CPC . *H03M 1/08* (2013.01); *H03M 1/38* (2013.01)
USPC .......................................... 341/163; 341/118

(58) Field of Classification Search
CPC ............................................ H03M 1/08–1/089
USPC ................................. 341/118, 161–163, 172
See application file for complete search history.

(56) References Cited

U.S. PATENT DOCUMENTS

| | | | | |
|---|---|---|---|---|
| 4,982,118 | A | 1/1991 | Lloyd | |
| 5,391,935 | A | 2/1995 | Gersbach et al. | |
| 6,225,937 | B1 | 5/2001 | Butler | |
| 6,603,415 | B1 | 8/2003 | Somayajula | |
| 7,827,454 | B2 | 11/2010 | Kurimoto | |
| 8,482,449 | B1 * | 7/2013 | Zabroda | 341/172 |
| 2010/0141499 | A1 * | 6/2010 | Mathe | 341/172 |
| 2014/0035771 | A1 * | 2/2014 | Tsai et al. | 341/172 |

FOREIGN PATENT DOCUMENTS

| | | | |
|---|---|---|---|
| JP | 05-152904 | A | 6/1993 |
| JP | 07-066689 | A | 3/1995 |
| JP | 11-505989 | A | 5/1999 |
| JP | 2009-044709 | A | 2/2009 |
| WO | 96/37962 | A1 | 11/1996 |

OTHER PUBLICATIONS

J. Yang et al., A 1 GS/s 6 Bit 6.7 mW Successive Approximation ADC Using Asynchronous Processing, IEEE Journal of Solid-State Circuits, vol. 45, No. 8, Aug. 2010, p. 1469-1478.*

* cited by examiner

*Primary Examiner* — Howard Williams
(74) *Attorney, Agent, or Firm* — White & Case LLP

(57) ABSTRACT

According to the present invention, a successive approximation type analog-digital converter includes: a comparator outputting a result of comparing an analog signal and a reference voltage; a register storing a digital value corresponding to the result of comparison and outputting a digital signal; a detection unit detecting whether the comparator is in a stable state or not for each bit; and a bit determination unit storing, if the comparator is not stable, as a bit value of a bit which is one bit lower-order than a corresponding detection bit, a value obtained by inverting a final determined bit value of the detection bit in the register instead of the comparison result of the comparator.

7 Claims, 13 Drawing Sheets

CORRECT OPERATION
INCORRECT OPERATION
ANALOG INPUT
ANALOG INPUT
D[3]
D[2]
D[1]
D[0]
CONVERSION ERROR
R1
R2
M
→0

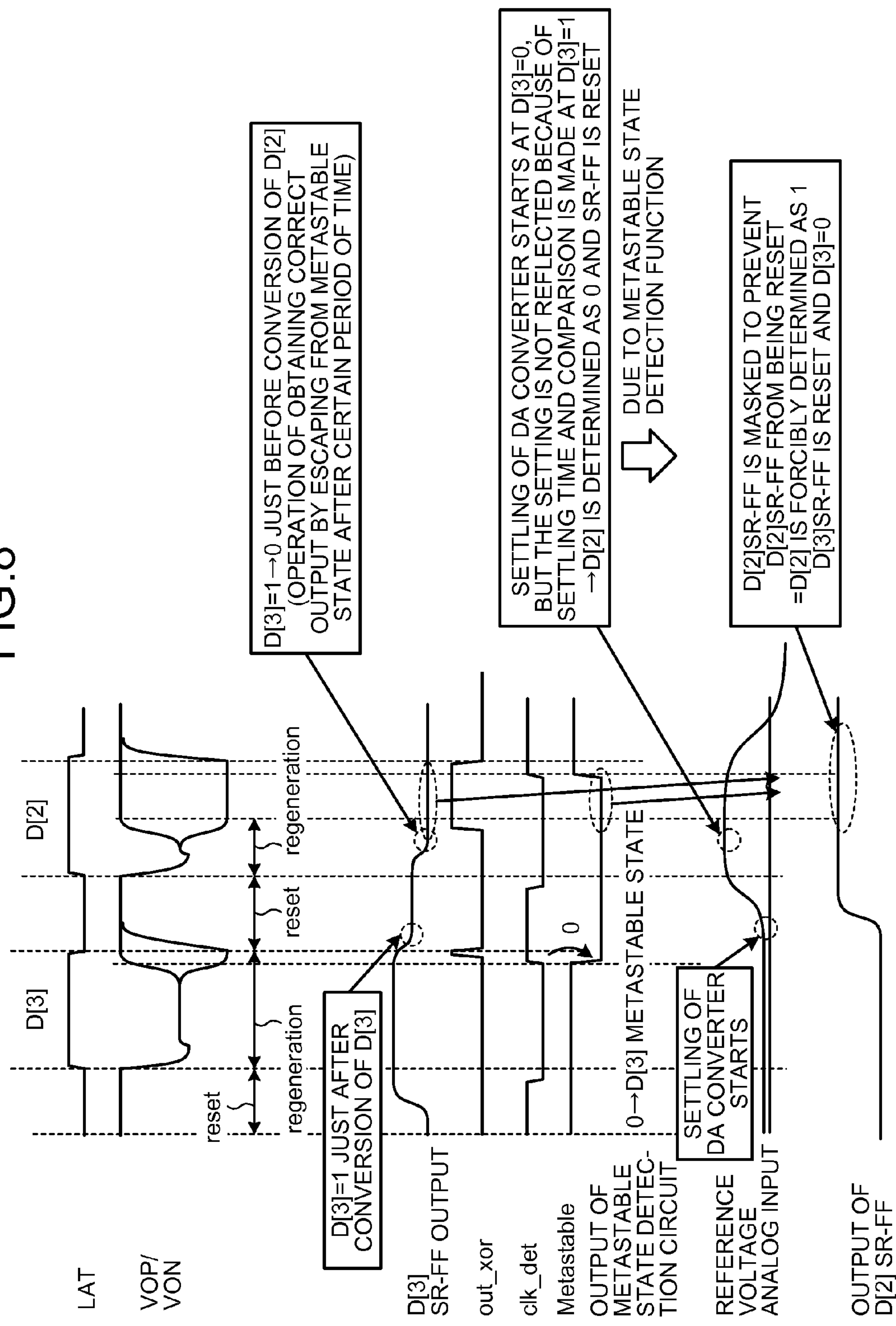
FIG.8
LAT
VOP/VON
D[3] SR-FF OUTPUT
out_xor
clk_det
Metastable
OUTPUT OF METASTABLE STATE DETECTION CIRCUIT
REFERENCE VOLTAGE ANALOG INPUT
OUTPUT OF D[2] SR-FF
reset
regeneration
reset
regeneration
D[3]
D[2]
0
0→D[3] METASTABLE STATE
D[3]=1 JUST AFTER CONVERSION OF D[3]
SETTLING OF DA CONVERTER STARTS
D[3]=1→0 JUST BEFORE CONVERSION OF D[2] (OPERATION OF OBTAINING CORRECT OUTPUT BY ESCAPING FROM METASTABLE STATE AFTER CERTAIN PERIOD OF TIME)
SETTLING OF DA CONVERTER STARTS AT D[3]=0, BUT THE SETTING IS NOT REFLECTED BECAUSE OF SETTLING TIME AND COMPARISON IS MADE AT D[3]=1 →D[2] IS DETERMINED AS 0 AND SR-FF IS RESET
DUE TO METASTABLE STATE DETECTION FUNCTION
D[2]SR-FF IS MASKED TO PREVENT D[2]SR-FF FROM BEING RESET =D[2] IS FORCIBLY DETERMINED AS 1 D[3]SR-FF IS RESET AND D[3]=0

SUCCESSIVE APPROXIMATION REGISTER FOR D[n-1] (SR-FF)
S Q
R Q̄
41-(n-1)
42-(n-1)
43-(n-1)
SR-FF OUTPUT D[n] OF NEXT HIGHER-ORDER BIT
METASTABLE STATE DETECTION CIRCUIT OUTPUT
COMPARATOR OUTPUT
PHASE[n - 1] SIGNAL
SUCCESSIVE APPROXIMATION REGISTER FOR D[n] (SR-FF)
S Q
R Q̄
41-n
42-n
43-n
SR-FF OUTPUT D[n+1] OF NEXT HIGHER-ORDER BIT
METASTABLE STATE DETECTION CIRCUIT OUTPUT
COMPARATOR OUTPUT
PHASE[n] SIGNAL

ANALOG-DIGITAL CONVERTER AND ANALOG-DIGITAL CONVERSION METHOD

CROSS-REFERENCE TO RELATED APPLICATIONS

This application is based upon and claims the benefit of priority from the prior Japanese Patent Application No. 2012-258614, filed on Nov. 27, 2012; the entire contents of which are incorporated herein by reference.

FIELD

The present embodiment generally relates to an analog-digital converter and an analog-digital conversion method.

BACKGROUND

In a successive approximation type ADC (Analog to Digital Converter), a reference voltage is input to a DAC (Digital to Analog Converter) and the set voltage of the DAC is compared with an input voltage, and by controlling the DAC so that the voltages get closest to each other, the input voltage is converted into a digital code. As the DAC system, a capacitor DAC, a resistor DAC, and the like are given.

In such a successive approximation type ADC, if the regeneration time of a comparator which compares the set voltage and the input voltage is long, a large conversion error might be caused. The regeneration time is time it takes for the output value of the comparator to stabilize from a metastable state (pre-stable state) to a stable state).

BRIEF DESCRIPTION OF THE DRAWINGS

FIG. 8 is a timing chart for describing an example of the detailed operation of the first embodiment;

DETAILED DESCRIPTION

According to an embodiment, a successive approximation analog-digital converter configured to convert an input analog signal to a digital signal includes a comparator, a register, a detection unit, and a bit determination unit. The comparator outputs a result of comparing the analog signal and a reference voltage for each bit. The register stores a digital value corresponding to the result of comparison for each bit, and outputs the digital signal. The detection unit detects whether the comparator is in a stable state or not for each bit. The bit determination unit stores, if the detection unit has produced a result that the state is not stable, as a bit value of a bit which is one bit lower-order than a detection bit where the result is detected, a value obtained by inverting a final determined bit value of the detection bit in the register instead of the result of comparison of the comparator.

(First Embodiment)

Figure 1:
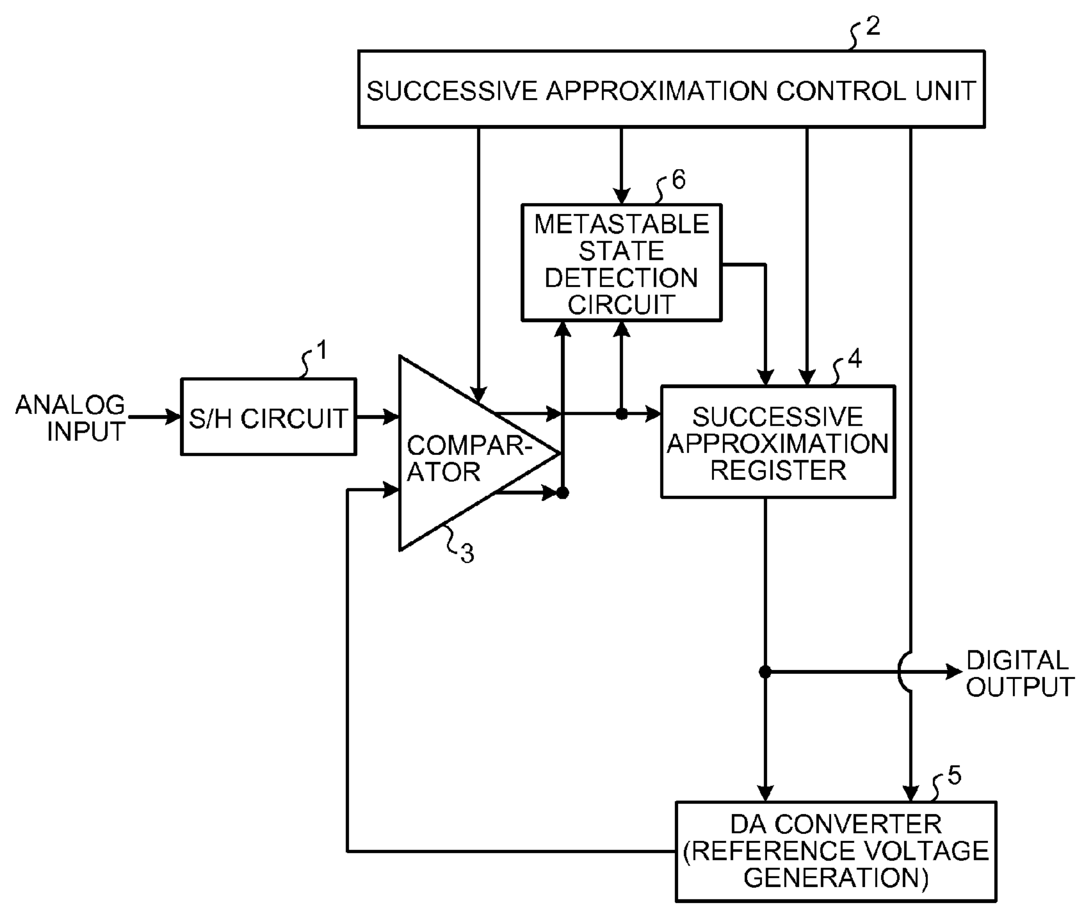
FIG. 1 is a block diagram illustrating a configuration example of an analog-digital converter according to a first embodiment.

FIG. 1 is a block diagram illustrating a configuration example of an analog-digital converter (hereinafter, an AD converter) according to a first embodiment. As illustrated in FIG. 1, an AD converter of this embodiment includes an S/H (sample/hold) circuit 1, a successive approximation control unit 2, a comparator 3, a successive approximation register 4, a DA (digital-analog) converter (hereinafter, a DA converter) 5 (reference voltage generation unit), and a metastable state detection circuit (detection unit) 6. The AD converter of this embodiment is a successive approximation type AD converter, and converts an input analog signal (analog input) into a digital output (digital code). The AD converter of this embodiment is mounted on, for example, a wireless or wired receiver, an electronic device or an electric appliance in which AD conversion is performed, and the like. Note that the S/H circuit 1 is not always necessary and the effect of this embodiment can be provided even when the S/H circuit 1 is omitted.

An analog signal (analog input) as a target of AD conversion is input to the S/H circuit 1. The S/H circuit 1 samples the input analog signal and outputs the signal to the comparator 3. The comparator 3 outputs, for each bit, a result of comparing the reference voltage input from the DA converter 5 and the signal input from the S/H circuit 1 to the successive approximation register 4. The DA converter 5 generates the reference voltage for comparison with the next bit on the basis of the comparison result input from the successive approximation register 4, and outputs the voltage to the comparator 3. The metastable state detection circuit 6 monitors the output of the comparator 3, and detects whether malfunction is caused by the metastable state for each bit. The successive approximation control unit 2 controls the timing or the like of the operation of the comparator 3, the successive approximation register 4, the DA converter 5, and the metastable state detection circuit 6. After the comparison is made on all the bits, the digital output (digital code) as the conversion result is output from the successive approximation register 4.

Figure 2:
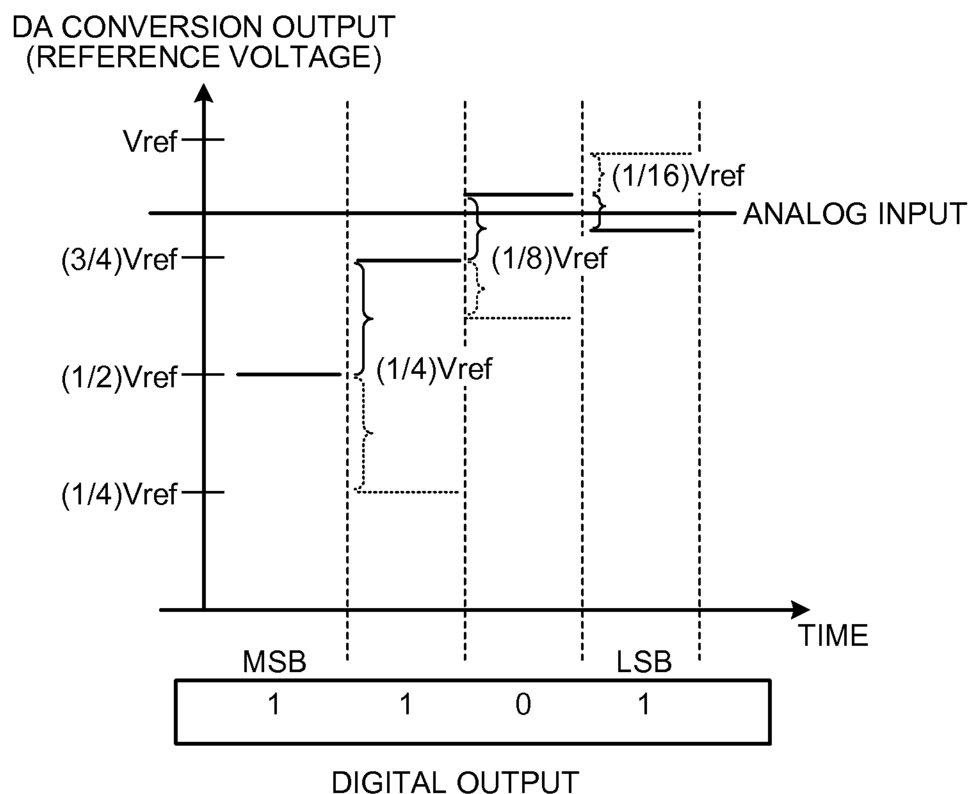
FIG. 2 is a diagram illustrating an example of the operation of the successive approximation AD conversion of the first embodiment.

The successive approximation AD conversion operation of the AD converter of this embodiment is described with reference to FIG. 2. FIG. 2 is a diagram illustrating the example of the successive approximation AD conversion operation of this embodiment. The description is made of the example in which a correct AD conversion result is 1101 as illustrated in FIG. 2. The reference voltage is weighted for each bit on the basis of the voltage Vref determining the input range for the AD converter. Note that although this embodiment describes the example of AD conversion of four bits, the bit number of the AD conversion is not limited to four. The successive approximation AD conversion operation for each bit is described below.

(1) Comparison Between Analog Input and (½)Vref (Comparison of First Bit (MSB (Most Significant Bit)))

(½)Vref is input as the reference voltage from the DA converter 5, and the analog input and (½)Vref are compared in the comparator 3. If the analog input>(½)Vref as a result of the comparison, 1 is stored in the successive approximation register 4 and (¼)Vref is added to the reference voltage by the DA converter 5. Meanwhile, if the analog input≤(½)Vref, 0 is stored in the successive approximation register 4 and (¼)Vref is subtracted from the reference voltage by the DA converter 5. In the example of FIG. 2, the analog input>(½)Vref; therefore, 1 is stored in the successive approximation register 4 and (¼)Vref is added to the reference voltage.

(2) Comparison Between the Analog Input and (½+(or −)¼)Vref (Comparison of Second Bit)

(½+(or −)¼)Vref is input as the reference voltage, and the analog input and the reference voltage are compared by the comparator 3. If the analog input> the reference voltage as a result of the comparison, 1 is stored in the successive approximation register 4 and (⅛)Vref is added to the reference voltage by the DA converter 5. Meanwhile, if the analog input≤ the reference voltage, 0 is stored in the successive approximation register 4 and (⅛)Vref is subtracted from the reference voltage by the DA converter 5. In the example of FIG. 2, the analog input> the reference voltage; therefore, 1 is stored in the successive approximation register 4 and (⅛)Vref is added to the reference voltage.

(3) Comparison Between the Analog Input and (½+(or −)¼+(or −)⅛)Vref (Comparison of 3Rd Bit)

(½+(or −)¼+(or −)⅛)Vref is input as the reference voltage, and the analog input and the reference voltage are compared by the comparator 3. If the analog input> the reference voltage as a result of the comparison, 1 is stored in the successive approximation register 4 and (1/16)Vref is added to the reference voltage by the DA converter 5. Meanwhile, if the analog input≤ the reference voltage, 0 is stored in the successive approximation register 4 and (1/16)Vref is subtracted from the reference voltage by the DA converter 5. In the example of FIG. 2, the analog input≤ the reference voltage; therefore, 0 is stored in the successive approximation register 4 and (1/16) Vref is subtracted from the reference voltage.

(4) Comparison Between the Analog Input and (½+(or −)¼+(Or −)⅛−(or +)1/16)Vref (Comparison of LSB (Least Significant Bit))

(½+(or −)¼+(or −)⅛−(or +)1/16)Vref is input as the reference voltage, and the analog input and the reference voltage are compared by the comparator 3. If the analog input> the reference voltage as a result of the comparison, 1 is stored in the successive approximation register 4. Meanwhile, if the analog input≤the reference voltage, 0 is stored in the successive approximation register 4. In the example of FIG. 2, the analog input>the reference voltage; therefore, 1 is stored in the successive approximation register 4.

As a result of thusly comparing the analog input and the reference voltage for each bit, the digital output of 1101 can be obtained in the example of FIG. 2.

In the successive approximation type AD converter, based on the conversion result of a certain bit, the reference voltage for the next bit is determined. If the metastable state (prestable state) of the comparator 3 continues long, a large conversion error might be caused. In general, if the absolute value of the difference of the input signal in the comparator 3 is smaller, the metastable state continues longer.

Figure 3:
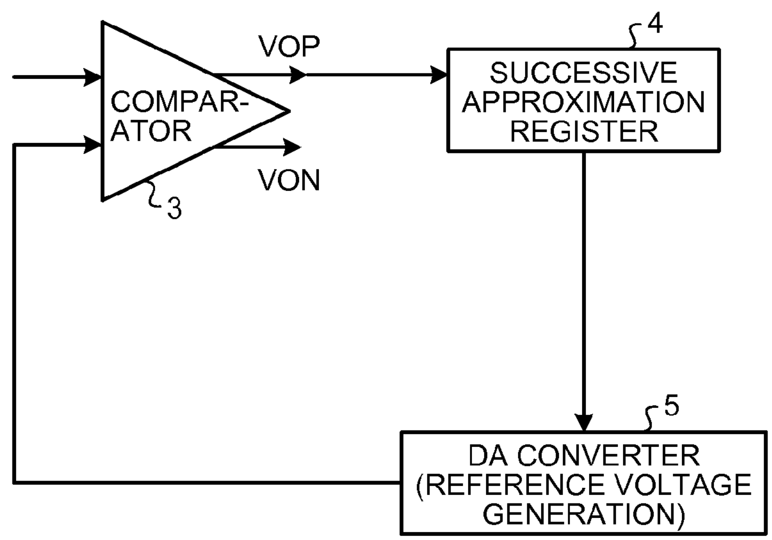
FIG. 3 is a diagram illustrating the extracted components of a part of the AD converter.
Figure 4:
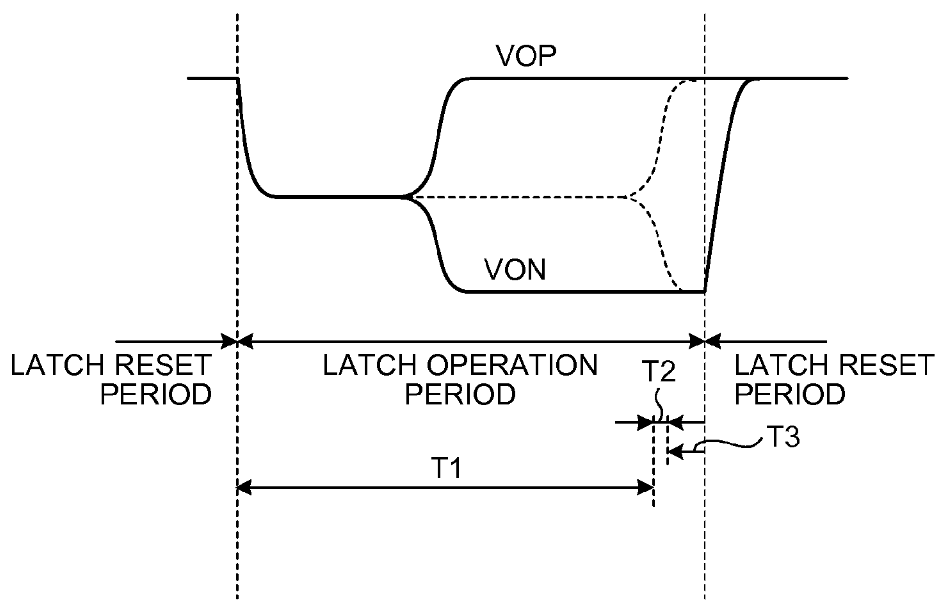
FIG. 4 is a diagram illustrating an example of the metastable state of a comparator.

FIG. 3 is a diagram illustrating the extracted components of a part of the AD converter. FIG. 4 is a diagram illustrating an example of the metastable state of the comparator 3. The two outputs of the comparator 3 are denoted by VOP and VON. The latch operation period illustrated in FIG. 4 represents the operation cycle of the comparator 3, and represents the period between a latch reset period (period where the latch of the comparator 3 is reset) and another latch reset period. If the difference of the signal input to the comparator 3 is small, the time (T1 in FIG. 4) until the VOP and VON are output stably and correctly becomes long (VOP and VON illustrated with a dotted line in FIG. 4). No problem is caused if the VOP and VON are stably and correctly output at early timing in the latch operation period as shown in the example illustrated with a solid line in FIG. 4. However, if T1 is long as in the example illustrated with a dotted line in FIG. 4 and the comparator 3 transits from the metastable state to the stable state in a certain time T2, which is before the end of the latch operation period by a predetermined time T3, a large conversion error might be caused due to the effects of the settling time of the DA converter 5 and the metastable state of the successive approximation register 4. The relation among T2, T3, the settling time of the DA converter 5, and the metastable state of the successive approximation register 4 is later described.

Figure 5:
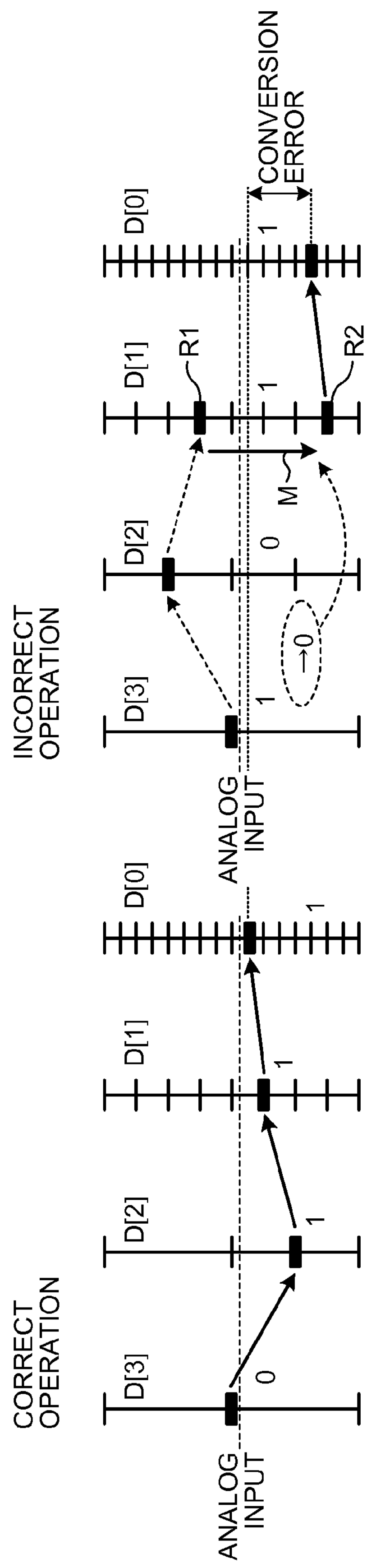
FIG. 5 is a diagram illustrating an example of the conversion error caused by the effect of the metastable state of the comparator.

FIG. 5 is a diagram illustrating an example of the conversion error caused by the effect of the metastable state of the comparator 3. FIG. 5 depicts one example of the conversion error caused when the detection by the metastable state detection circuit 6 and the forcible bit determination of this embodiment, which are later described, are not performed. In FIG. 5, bits are denoted by D[3], D[2], D[1], and D[0] from the MSB side. The left part of FIG. 5 illustrates the example where the conversion is correctly performed, while the right part thereof illustrates the example where a conversion error is caused due to the effect of the metastable state of the comparator 3 in the time slot for comparing the bit D[3] (the latch operation time slot for comparing the bit D[3]). If the metastable state transits to the stable state in a certain period of time, which is close to the end of the latch operation time, as indicated by T2 in FIG. 4, the state is metastable in the period T1; therefore, the correct comparison result might not be obtained.

For example, as in the example illustrated in the right part of FIG. 5, it is assumed that although the correct D[3] is 0, D[3] is determined as 1 by mistake in the period T1 (metastable state) in the latch operation period, and then the D[3] is determined as 0 correctly in the period T2 in the latch operation period. In this case, the conversion result of the D[3] is determined as 0 and input into the successive approximation register 4. However, in the generation of the reference voltage of the next bit D[2], the conversion result of D[3]=0 is not reflected due to the settling time of the DA converter 5, and the reference voltage based on D[3]=1 is generated (the reference voltage becomes +¼Vref although the voltage should be −¼Vref). Therefore, in the D[2], the analog input and (½+¼)Vref are compared and erroneous determination is made as D[2]=0. Meanwhile, D[3]=0 is set in the successive approximation register 4; therefore, the DA converter 5 generates the reference voltage corresponding to D[3]=0 and D[2]=0 (i.e., (½−¼−⅛)Vref) and inputs the voltage into the comparator 3. Accordingly, in the comparison of the D[1], the comparator 3 compares the analog input and the reference voltage corresponding to D[3]=0 and D[2]=0, and D[1]=1 is output as the comparison result. As for the D[0], the analog input and the reference voltage corresponding to D[3]=0, D[2]=0, and D[1]=1 are compared and D[0]=1 is output.

Due to the effect of the metastable state of the comparator 3, although the correct value is determined finally for the bit D[3], the conversion error in the determination result of the lower-order bit is caused because of the effect of the erroneous value before the determination of the bit D[3].

Figure 6:
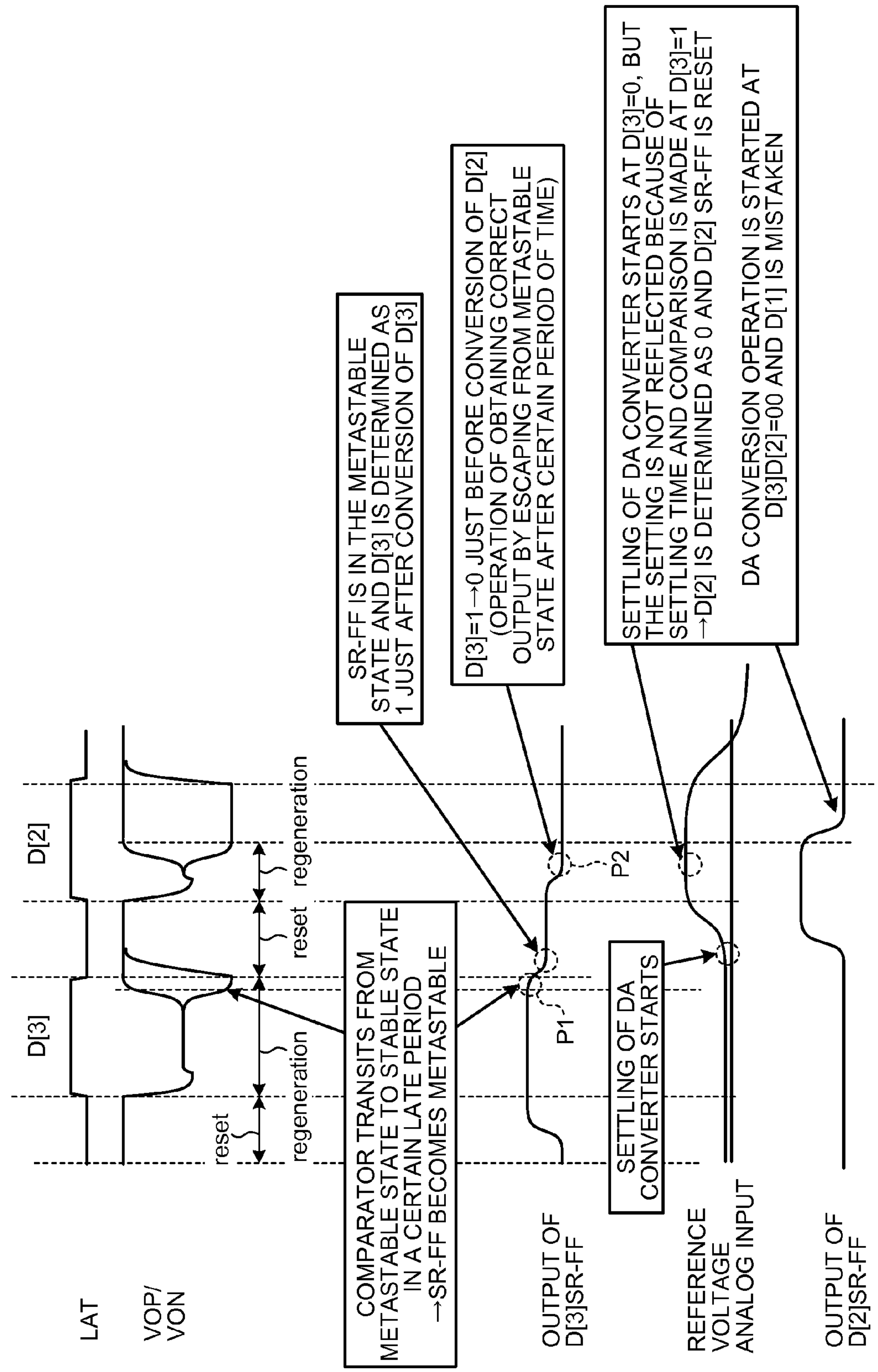
FIG. 6 is a timing chart for describing the detailed operation of an example of erroneous determination illustrated in FIG. 5.

FIG. 6 is a timing chart for describing the detailed operation of the erroneous determination example described with reference to FIG. 5. The uppermost stage (LAT) in FIG. 6 represents whether the latch of the comparator 3 is in the operation state or the reset state. The second stage represents the output VOP or VON of the comparator 3. The third stage represents the output of the bit D[3] of the successive approximation register 4 (abbreviated as D[3]SR-FF in the chart). The fourth stage represents the reference voltage and the analog input, and the fifth stage represents the output of the bit D[2] of the successive approximation register 4 (abbreviated as D[2]SR-FF in the chart). If, in the time slot for comparing the bit D[3] (comparison cycle), the metastable state of the comparator 3 continues until P1 (a certain time within the period T2 in FIG. 4) and becomes the stable state at P1, a correct comparison result (0 in the example of FIG. 5) is input to the successive approximation register 4. However, the FF (flip-flop circuit) of the bit D[3] of the successive approximation register 4 becomes metastable and D[3] is determined as 1. The metastable state of the FF of the bit D[3] of the successive approximation register 4 continues until P2, becomes the stable state at P2, and the D[3] is determined as 0. In the DA converter 5, based on the result that the bit D[3] of the successive approximation register 4 at P1 is determined as 1, the settling is started and then the bit D[3] of the successive approximation register 4 is changed to the correct value at P2. However, by the settling time, this change is not reflected when the reference voltage is generated and the comparison of the D[2] is performed (the reference voltage in the case where D[3] is determined as 1 is generated). Therefore, in the case of FIG. 5, the comparator 3 determines D[2]=0. Meanwhile, after the comparison of the bit D[2], D[3]=0 and D[2]=0 in the successive approximation register 4. Based on this comparison result, the reference voltage for comparing the bit D[1] is generated. Accordingly, a reference voltage R2, which is largely different from a reference voltage R1 set after the reference voltage of D[3]=1 and D[2]=0, is generally generated, which causes the conversion error.

If the transition of the comparator 3 from the metastable state to the stable state occurs in the period T2, 1011 is obtained as illustrated in the right part of FIG. 5. Meanwhile, if the transition of the comparator 3 from the metastable state to the stable state occurs in the period T3, 1000 is obtained. Thus, the error from the correct conversion result is extremely smaller in the latter case than in the former case. This embodiment describes the AD converter that can reduce a large conversion error which is caused when the transition of the comparator 3 from the metastable state to the stable state occurs in the period T2.

The periods T2 and T3 are determined based on the settling time of the DA converter 5, the time for which the metastable state of the successive approximation register 4 continues, etc.; in other words, the periods T2 and T3 are determined based on various constants and the like of the circuits.

In this embodiment, the metastable state detection circuit 6 is provided which detects whether the transition of the comparator 3 from the metastable state to the stable state occurs (hereinafter, simply, the state is metastable) in the period T2 or not. When the metastable state detection circuit 6 has detected the state is metastable, the bit value of the bit, which is one bit lower-order than the bit compared at the time of the detection, is forcibly determined.

Figure 7:
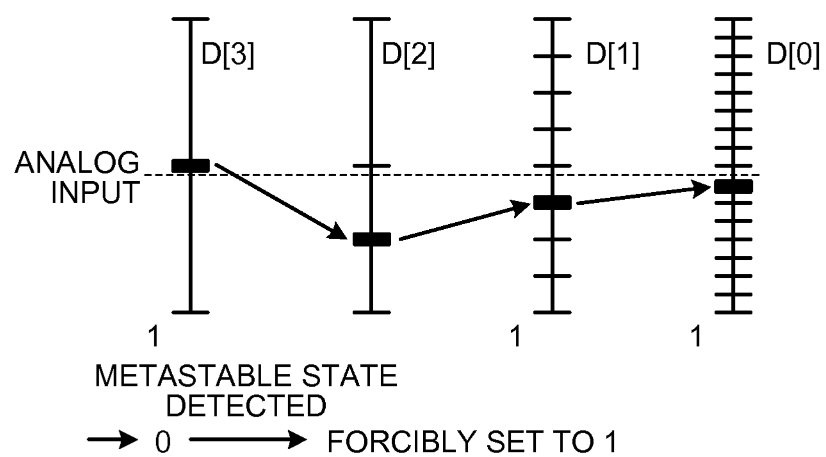
FIG. 7 is a diagram illustrating an example of bit determination of the first embodiment.

FIG. 7 is a diagram illustrating an example of the bit determination of this embodiment. In this embodiment, the value opposite to the final determination result (after the stable state is obtained) of the bit compared at the time when the metastable state detection circuit 6 has detected the state is metastable is forcibly determined as the bit value of the next lower-order bit. For example, if the bit compared when the metastable state detection circuit 6 has detected the state is metastable is determined as 0 finally, the next lower-order bit is set to 1. If the bit compared when the metastable state detection circuit 6 has detected the state is metastable is determined as 1 finally, the next lower-order bit is set to 0. FIG. 7 illustrates the example in which, if there is the same analog input as that in the erroneous conversion of FIG. 5, the state transits from the metastable state to the stable state in the period T2 in the time slot for comparing the bit D[3] in a manner similar to FIG. 5. As illustrated in FIG. 7, in this embodiment, the metastable state detection circuit 6 detects the metastable state in the time slot for comparing the bit D[3] and the next lower-order bit D[2] is forcibly set to 1. Thus, the digital output as the conversion result becomes 0111 and the correct result is produced.

FIG. 8 is a timing chart illustrating an example of the detailed operation in this embodiment. As illustrated in FIG. 8, when the metastable state detection circuit 6 has detected the metastable state in the time slot for comparing the bit D[3], the finally determined value of the bit D[3] is 0. Therefore, the value of the D[2] of the successive approximation register 4 is set to 1 regardless of the comparison result of the bit D[2]. The timing for obtaining the finally determined value of the bit D[3] is preferably as late as possible in order to increase the probability of the transition from the metastable state to the stable state, and is set to the timing prior to the forcible determination of the value of the D[2]. If the timing for forcibly determining the value of the D[2] is set later in the latch operation period for comparing the D[2], the latch operation period for comparing the D[2] can also be used for the time till the determination of the bit D[3]. Therefore, the probability of the transition of the metastable state to the stable state, which has occurred in the time slot for comparing the bit D[3], is increased, which leads to high possibility of leading the correct value as the comparison result of the bit D[3].

The SR-FF of each bit of the successive approximation register 4 is set at the start of the comparison cycle for each bit (i.e., 1 is stored). Normally, depending on the comparison result of the comparator 3, nothing is done when the comparison result is 1 and the reset signal is input to the SR-FF when the comparison result is 0. Therefore, if the FF (SR-FF) of the D[2] of the successive approximation register 4 is not reset, 1 is stored; if the FF is reset, 0 is stored. The example is shown in which the FF (SR-FF) of the D[2] is masked so that the FF (SR-FF) of the D[2] is not reset, thereby forcibly determining the D[2] as 1. However, the method of forcibly determining the bit is not limited to this example.

Figure 9:
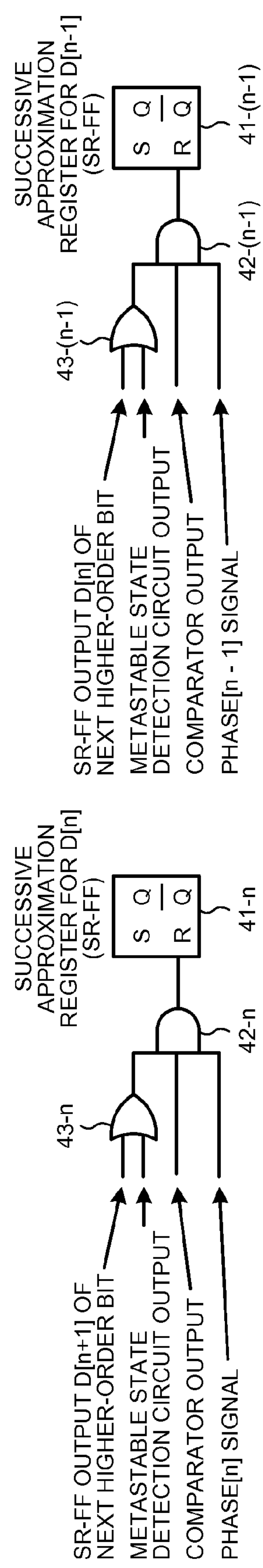
FIG. 9 is a diagram illustrating an example of a mask circuit of a successive approximation register.

FIG. 9 is a diagram illustrating an example of a mask circuit of the successive approximation register 4. The successive approximation register 4 of this embodiment includes an SR-FF41-n (n is a positive integer) for storing the comparison result of the bit D[n] for each bit. The SR-FF41-n receives the output of an AND circuit 42-n. The AND circuit 42-n receives the output of the comparator 3, a phase[n] signal (signal indicating phase[n]), and the output of an OR circuit 43-n. The phase[n] represents the latch operation period for comparing D[n]. The OR circuit 43-n receives the output of the metastable state detection circuit 6, and the output of the SR-FF for the next higher-order bit D[n+1]. Thus, if the metastable state detection circuit 6 has detected the metastable state in the time slot for comparing the bit D[n], the output (=0) of the metastable state detection circuit is delayed and propagates to the phase[n−1]. Thereby the bit D[n−1] is forcibly determined as 1 when D[n]=0 (masking is performed so as not to reset). Although FIG. 9 illustrates the example in which the mask circuit (bit determination unit) is provided in the successive approximation register 4, the mask circuit (bit determination unit) may be provided separate from the successive approximation register 4.

For example, it is assumed that the metastable state is detected in the D[3] and the final determined bit value of the bit D[3] is 0. In this case, in the comparison cycle of the D[2], 0 as the value representing the metastable state detection is input as the detection result from the metastable state detection circuit 6 and 0 is input from the SR-FF of the D[3]. Therefore, the output of the OR circuit 43-n is 0. In the comparison cycle of the D[2], since the phase[2] signal is 1, 0 is input from the AND circuit 42-n to the SR-FF41-2 (indicating that the SR-FF41-2 is not reset) regardless of the output value of the comparator 3. As a result, the value of the SR-FF41-2, i.e., the bit D[2] is determined as 1. On the other hand, it is assumed that the metastable state is detected in the D[3] and the final determined bit value of the bit D[3] is 1. In this case, the output of the OR circuit 43-n is 1. In the comparison cycle of the D[2], since the phase[2] signal is 1, the output of the AND circuit 42-n is the same as the output of the comparator 3.

FIG. 9 illustrates one example, and the configuration of the mask circuit of the successive approximation register 4 of this embodiment is not limited to the example of FIG. 9. In the example of FIG. 9, if the final determined bit value of the bit D[3] is 0, the SR-FF of the next lower-order bit is not forcibly reset regardless of the output of the comparator 3 and the D[2] is determined as 1. However, even if the final determined bit value of the bit D[3] is 1, the SR-FF of the next lower-order bit may be reset forcibly regardless of the output of the comparator 3.

Thus, in this embodiment, the metastable state detection circuit 6 which detects whether the comparator 3 is metastable or not is provided. When the metastable state detection circuit 6 has detected the metastable state, the value of the bit which is one bit lower-order than the bit as the determination target at the time of the detection is forcibly determined. Thus, the occurrence of the large conversion error due to the effect of the metastable state of the comparator 3 can be prevented.

In this embodiment, since the bit to be forcibly determined is just one bit, the mask circuit can be simplified. Therefore, the excessive increase in size and power consumption, signal interference, and the like can be suppressed.

(Second Embodiment)

Next, an AD converter according to a second embodiment is described. The overall configuration of the AD converter of this embodiment is similar to the AD converter of the first embodiment illustrated in FIG. 1. The component having the similar function to that of the first embodiment is denoted by the same reference symbol and the description thereof is not repeated.

In the first embodiment, when the metastable state of the comparator 3 has been detected, based on the final comparison result of the bit compared at the detection time, the value of the next lower-order bit is forcibly determined. In this embodiment, when the metastable state of the comparator 3 has been detected, the values of both the bit as the determination target at the detection time and the next lower-order bit are forcibly determined.

Figure 10:
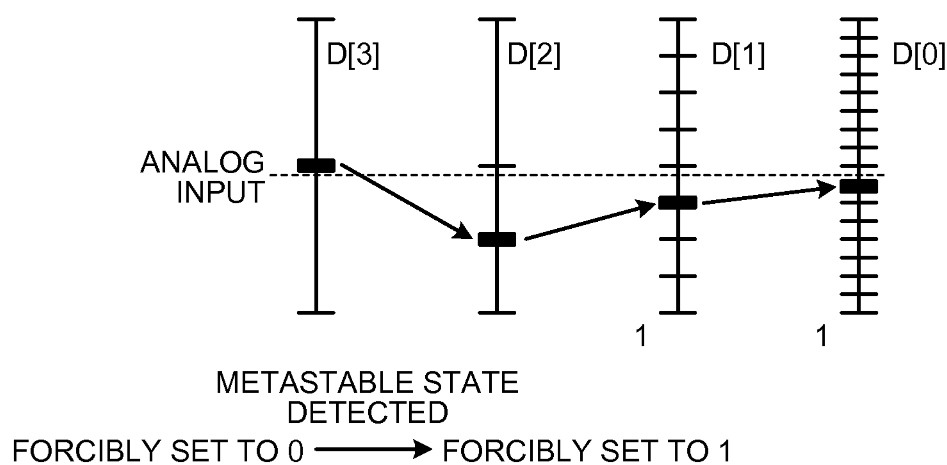
FIG. 10 is a diagram illustrating an example of bit determination of a second embodiment.

FIG. 10 is a diagram illustrating an example of the bit determination of this embodiment. As illustrated in FIG. 10, if the metastable state is detected in the time slot of comparing the bit D[3], the bit D[3] is forcibly determined as 0, and the next lower-order bit D[2] is determined as 1. Alternatively, the bit D[3] is forcibly determined as 1 and the next lower-order bit D[2] is forcibly determined as 0. By thusly determining the bits forcibly, the large conversion error as illustrated in the example of the right part of FIG. 5 can be prevented.

Figure 11:
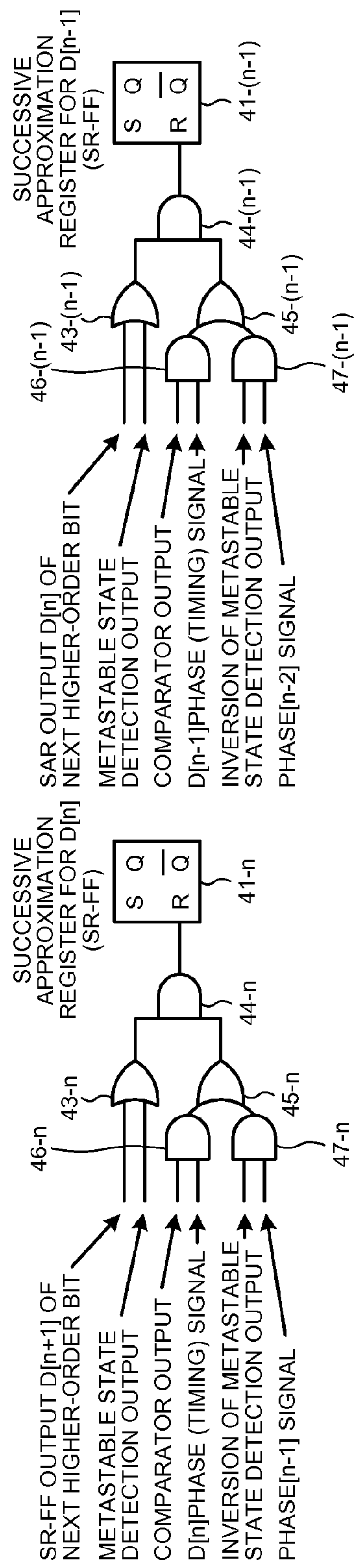
FIG. 11 is a diagram illustrating an example of a mask circuit of a successive approximation register of the second embodiment.

FIG. 11 is a diagram illustrating one example of the mask circuit of the successive approximation register 4 of this embodiment. The successive approximation register 4 of this embodiment includes the FF(SR-FF)41-n for storing the comparison result of the bit D[n] (n is a positive integer) for each bit. The SR-FF41-n is connected to the AND circuit 44-n. The AND circuit 44-n receives the output of the OR circuit 43-n and the output of an OR circuit 45-n. The OR circuit 45-n receives the output of an AND circuit 46-n and the output of an AND circuit 47-n. The AND circuit 46-n receives the output of the comparator 3 and the signal representing the timing of phase[n]. The AND circuit 47-n receives the signal obtained by inverting the output of the metastable state detection circuit 6 and the phase[n−1] signal. The OR circuit 43-n receives the output of the metastable state detection circuit 6 and the output of the SR-FF41-(n+1) for the next higher-order bit D[n+1].

The example illustrated in FIG. 11 is just one example and the configuration of the mask circuit of the successive approximation register 4 of this embodiment is not limited to the example of FIG. 11.

As thus described, in this embodiment, the metastable state detection circuit 6 which detects whether the comparator 3 is metastable or not is provided. When the metastable state has been detected by the metastable state detection circuit 6, the bit values of the bit as the determination target at the detection time and the next lower-order bit are forcibly determined. Therefore, the occurrence of the large conversion error due to the effect of the metastable state of the comparator 3 can be prevented.

(Third Embodiment)

Figure 12:
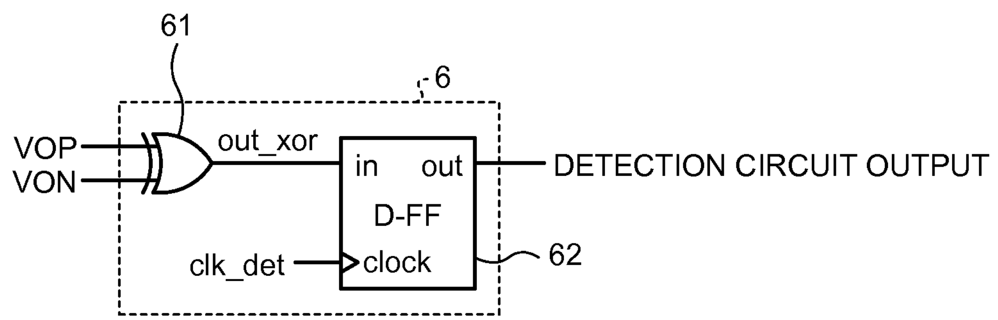
FIG. 12 is a diagram illustrating a configuration example of a metastable state detection circuit of a third embodiment.

FIG. 12 is a diagram illustrating a configuration example of the metastable state detection circuit 6 of a third embodiment. The overall configuration of the AD converter of this embodiment is similar to the AD converter of the first embodiment illustrated in FIG. 1. The component having the similar function to that of the first embodiment is denoted by the same reference symbol as that of the first embodiment, and the description thereof is not repeated.

In this embodiment, the configuration example of the metastable state detection circuit 6 is described. The circuit configuration illustrated in FIG. 12 is applicable to the metastable state detection circuit 6 in the AD converter described in the first embodiment and the second embodiment, for example. The metastable state detection circuit 6 illustrated in FIG. 12 includes an XOR circuit 61 (internal signal generation unit), and a flip-flop (D-FF) 62 (internal signal holding unit). The XOR circuit 61 inputs the XOR calculation results out_xor of VOP and VON, which are the output of the comparator 3, to the flip-flop 62. The flip-flop 62 receives the clk_det, which is the signal representing the timing of the metastable state detection from the successive approximation control unit 2. The flip-flop 62 outputs the value of out_xor at the time of rise of the clk_det as the result of the metastable state detection.

Figure 13:
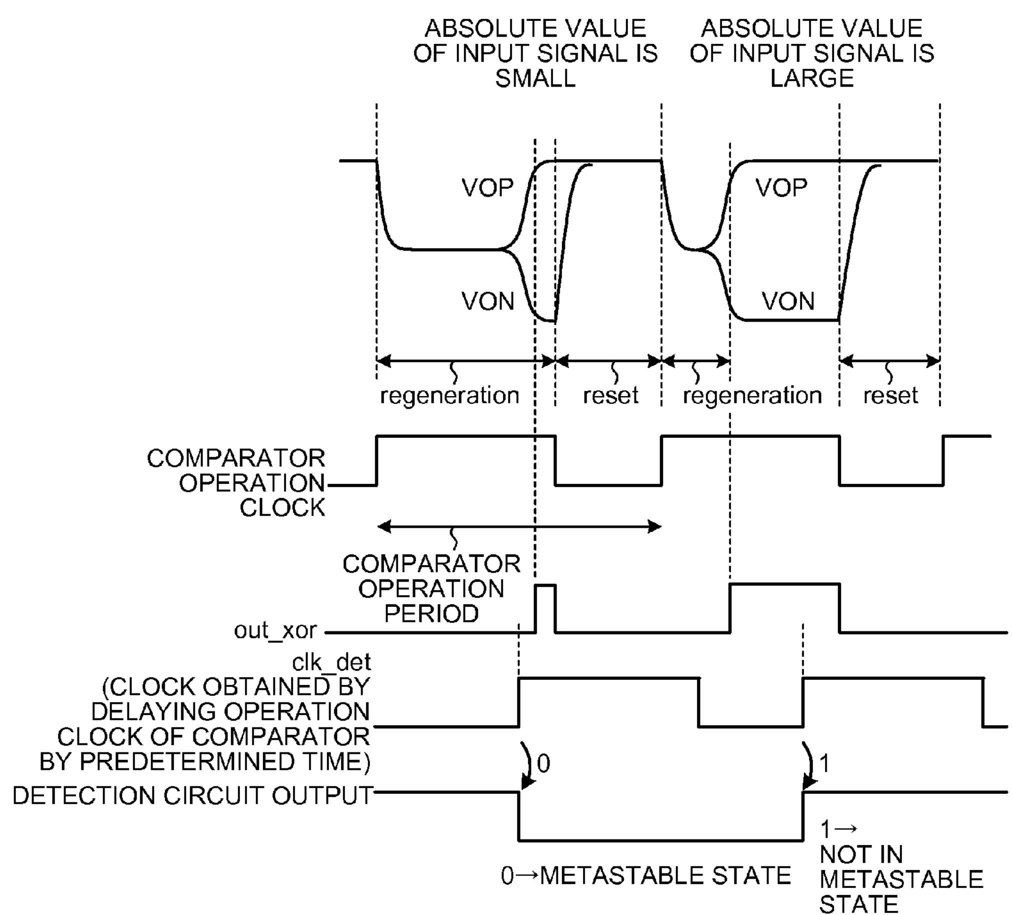
FIG. 13 is a diagram illustrating an example of operation timing of the metastable state detection circuit of the third embodiment.

FIG. 13 is a diagram illustrating one example of the operation timing of the metastable state detection circuit 6 of this embodiment. The uppermost stage represents the output VOP and VON of the comparator (comparator) 3, and the second stage represents the operation clock of the comparator 3. The third stage represents the output out_xor of the XOR circuit 61 of the metastable state detection circuit 6. The fourth stage represents the clk_det. The clk_det is the clock obtained by delaying the operation clock of the comparator 3 by a predetermined time. Thus, if the comparator 3 is in the metastable state and the output value of the comparator 3 is not stable at the time of the rise of the clk_det, the value of out_xor is 0 and 0 (metastable state detected) is output as the detection result of the metastable state detection. If the output value of the comparator 3 is stable at the time of the rise of the clk_det, the value of out_xor is 1 and 1 (metastable state not detected) is output as the detection result of the metastable state detection.

Figure 14:
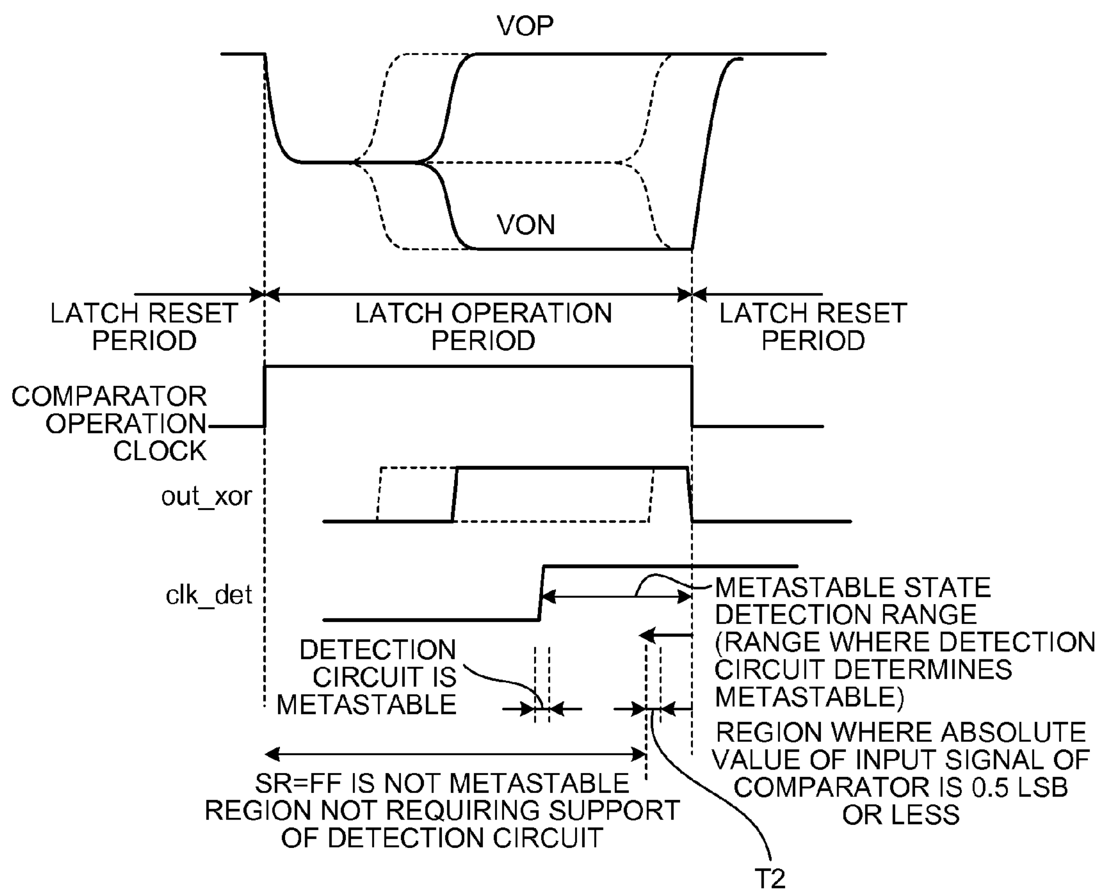
FIG. 14 is a timing chart illustrating an example of timing at which clk_det rises.

FIG. 14 is a timing chart illustrating one example of the rising timing of the clk_det. The clk_det needs to be risen after time which is after the operation clock of the comparator 3 rises and before the absolute value of the input signal of the comparator 3 becomes 0.5 LSB or less (the time depends on the circuit constant of the comparator 3). Moreover, the rise of the clk_det needs to be prior to the period T2 in FIG. 4 in order to detect whether the state is metastable or not in the period T2 in FIG. 4.

Further, for a while after the rise of the clk_det, the metastable state detection circuit 6 itself is in the metastable state. Therefore, in order to obtain the correct detection result of the metastable state detection circuit 6, it is desirable that the timing of the rise of the clk_det is determined considering the period in which the metastable state detection circuit 6 itself is in the metastable state (period where the detection circuit is described as being metastable in FIG. 14). In other words, it is desirable that the timing of the rise of the clk_det is determined so that the detection of the period T2 can be performed after the end of the metastable state of the metastable state detection circuit 6 itself. By thusly determining the timing, the mask circuit is not adversely affected even though the metastable state detection circuit itself becomes metastable.

If the bit determination method of the second embodiment is carried out, the metastable state of the metastable state detection circuit 6 needs to be considered. However, if the bit determination method of the first embodiment is carried out, the consideration of the metastable state of the metastable state detection circuit 6 itself is not always necessary. This depends on the timing of the rise of the clk_det determined by the metastable state detection circuit and the configuration of the mask circuit configuration illustrated in FIG. 9. As one example, it is assumed that the mask circuit of the successive approximation register 4 has the configuration as illustrated in FIG. 9. If D[n]=1 and the output of the metastable state detection circuit 6 is 0 (metastable state detected), nothing is done on the D[n−1] in the successive approximation register 4 regardless of the comparison result of the comparator 3. In other words, if D[n]=1, the bit value of the D[n−1] is determined as 0; therefore, the reset signal may be input to the SR-FF of the successive approximation register 4. The reset signal is input if nothing is done. Therefore, when D[n]=1 and the output of the metastable state detection circuit 6 is 0 (metastable state detected), nothing is done in the successive approximation register 4. If D[n]=0, the bit value of the D[n−1] is determined as 1; however, if the metastable state is detected, D[n−1]=1 in principle. Therefore, the comparison result of the comparator 3, i.e., the reset signal is L (not reset), whereby the reset signal does not need to be masked.

The configuration example of the metastable state detection circuit 6 is thus described in this embodiment. By using the metastable state detection circuit 6 as above, the forcible bit determination as described in the first embodiment and the second embodiment can be carried out when the metastable state of the comparator 3 is detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A successive approximation type analog-digital converter configured to convert an input analog signal into a digital signal, comprising:

a comparator configured to output a result of comparing the analog signal and a reference voltage for each bit;

a register configured to store a digital value corresponding to the result of comparison for each bit and output the digital signal;

a detection unit configured to detect whether the comparator is in a stable state or not for each bit; and a bit determination unit configured to, if the detection unit has produced a result that the state is not stable, store as a bit value of a bit which is one bit lower-order than a detection bit where the result is detected, a value obtained by inverting a final determined bit value of the detection bit in the register instead of the result of comparison of the comparator, the detection unit comprising:

an internal signal generation unit configured to output first logical value as an internal signal when logical values of two output signals output from the comparator are equal to each other, and second logical value different from the first logical value as the internal signal when the logical values of the two output signals are different from each other; and an internal signal holding unit configured to latch the internal signal, wherein the internal signal holding unit outputs the internal signal after a first predetermined period of time from start of a comparison cycle of the bit, as a detection result of the detection unit, wherein the detection unit detects for each bit whether the comparator is in a stable state or not after a second predetermined period of time from start of the comparison cycle of the bit based on the comparison result, wherein the bit determination unit stores the bit value based on the result produced by the detection unit after a third predetermined period of time from start of the comparison cycle of the bit, the third predetermined period of time being determined considering a period in which the detection unit itself is in a metastable state.

2. A successive approximation type analog-digital converter configured to convert an input analog signal into a digital signal, comprising:

a comparator configured to output a result of comparing the analog signal and a reference voltage for each bit;

a register configured to store a digital value corresponding to the result of comparison for each bit and output the digital signal;

a detection unit configured to detect whether the comparison result is in a stable state or not for each bit; and a bit determination unit configured to, if the detection unit has produced a result that the state is not stable, store as a bit value of a detection bit where the result is detected, a first value in the register instead of the result of comparison of the comparator and store as a bit value of a bit which is one bit lower-order than the detection bit, a second value obtained by inverting the first value to the register instead of the result of comparison of the comparator, the detection unit comprising:

an internal signal generation unit configured to output first logical value as an internal signal when logical values of two output signals output from the comparator are equal to each other, and second logical value different from the first logical value as the internal signal when the logical values of the two output signals are different from each other; and an internal signal holding unit configured to latch the internal signal, wherein the internal signal holding unit outputs the internal signal after a first predetermined period of time from start of a comparison cycle of the bit, as a detection result of the detection unit, wherein the detection unit detects for each bit whether the comparator is in a stable state or not after a second predetermined period of time from start of the comparison cycle of the bit based on the comparison result, wherein the bit determination unit stores the bit value based on the result produced by the detection unit after a third predetermined period of time from start of the comparison cycle of the bit, the third predetermined period of time being determined considering a period in which the detection unit itself is in a metastable state.

3. The analog-digital converter according to claim 2, wherein the first value is 1.

4. The analog-digital converter according to claim 2, wherein the first value is 0.

5. An analog-digital conversion method of a successive approximation type analog-digital converter configured to convert an input analog signal into a digital signal and including a comparator configured to output a result of comparing the analog signal and a reference voltage for each bit, and a register configured to store a digital value corresponding to the result of comparison for each bit and output the digital signal, the method comprising:

detecting, by a detection unit, whether the comparator is in a stable state or not for each bit; and if a result of the detection indicates that the state is not stable, storing as a bit value of a bit which is one bit lower-order than a detection bit where the result is detected, a value obtained by inverting a final determined bit value of the detection bit in the register instead of the comparison result of the comparator, wherein the detecting comprising:

outputting first logical value as an internal signal when logical values of two output signals output from the comparator are equal to each other, and second logical value different from the first logical value as the internal signal when the logical values of the two output signals are different from each other; and latching the internal signal, wherein the internal signal is outputted after a first predetermined period of time from start of a comparison cycle of the bit, as a detection result of the detection unit, wherein the detecting is performed after a second predetermined period of time from start of the comparison cycle of the bit based on the comparison result, wherein the storing is performed after a third predetermined period of time from start of the comparison cycle of the bit, the third predetermined period of time being determined so that the storing is performed after a period in which the detection unit itself is in a metastable state.

6. A successive approximation type analog-digital converter configured to convert an input analog signal into a digital signal, comprising:

a comparator configured to output a result of comparing the analog signal and a reference voltage for each bit;

a register configured to store a digital value corresponding to the result of comparison for each bit and output the digital signal;

a detection unit configured to detect whether the comparator is in a stable state or not for each bit; and a bit determination unit configured to, if the detection unit has produced a result that the state is not stable and the register is reset, store as a bit value of a bit which is one bit lower-order than a detection bit where the result is detected, a value obtained by inverting a final determined bit value of the detection bit in the register instead of the result of comparison of the comparator, wherein the detection unit comprising:

an internal signal generation unit configured to output first logical value as an internal signal when logical values of two output signals output from the comparator are equal to each other, and second logical value different from the first logical value as the internal signal when the logical values of the two output signals are different from each other; and an internal signal holding unit configured to latch the internal signal, wherein the internal signal holding unit outputs the internal signal after a first predetermined period of time from start of a comparison cycle of the bit, as a detection result of the detection unit, wherein the detection unit detects for each bit whether the comparator is in a stable state or not after a second predetermined period of time from start of the comparison cycle of the bit based on the comparison result.

7. An analog-digital conversion method of a successive approximation type analog-digital converter configured to convert an input analog signal into a digital signal and including a comparator configured to output a result of comparing the analog signal and a reference voltage for each bit, and a register configured to store a digital value corresponding to the result of comparison for each bit and output the digital signal, the method comprising:

detecting, by a detection unit, whether the comparator is in a stable state or not for each bit; and if a result of the detection indicates that the state is not stable and the register is reset, storing as a bit value of a bit which is one bit lower-order than a detection bit where the result is detected, a value obtained by inverting a final determined bit value of the detection bit in the register instead of the comparison result of the comparator, the detecting comprising:

outputting first logical value as an internal signal when logical values of two output signals output from the comparator are equal to each other, and second logical value different from the first logical value as the internal signal when the logical values of the two output signals are different from each other; and latching the internal signal, wherein the outputting is performed after a predetermined period of time, wherein the detecting is performed after a second predetermined period of time from start of the comparison cycle of the bit based on the comparison result, wherein the storing is performed after a third predetermined period of time from start of the comparison cycle of the bit, the third predetermined period of time being determined so that the storing is performed after a period in which the detection unit itself is in a metastable state.

* * * * *